United States Patent
Sembonmatsu et al.

(10) Patent No.: US 6,357,595 B2
(45) Date of Patent: *Mar. 19, 2002

(54) TRAY FOR SEMICONDUCTOR INTEGRATED CIRCUIT DEVICE

(75) Inventors: Shigeru Sembonmatsu, Tokyo; Manabu Ishikawa, Ichihara, both of (JP)

(73) Assignees: NEC Corporation, Tokyo; Sumitomo Chemicae, Chiba, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/559,348

(22) Filed: Apr. 27, 2000

(30) Foreign Application Priority Data

Apr. 30, 1999 (JP) .......................................... 11/124326

(51) Int. Cl.$^7$ ................................................ B65D 85/00
(52) U.S. Cl. ....................................... 206/726; 206/564
(58) Field of Search ................................ 206/713, 714, 206/716, 717, 722, 725, 726, 561, 562, 564, 565

(56) References Cited

U.S. PATENT DOCUMENTS

| | | | |
|---|---|---|---|
| 5,400,904 A | | 3/1995 | Maston, III. et al. |
| 5,418,692 A | * | 5/1995 | Nemoto ...................... 206/725 |
| 5,848,702 A | * | 12/1998 | Pakeriasamy ................ 206/725 |
| 5,957,293 A | * | 9/1999 | Pakeriasamy ................. 206/725 |
| 5,964,353 A | * | 10/1999 | Hamlin ........................ 206/714 |
| 6,036,023 A | * | 3/2000 | Pfahni et al. ................ 206/725 |
| 6,071,056 A | * | 6/2000 | Hollowell .................... 206/725 |
| 6,079,565 A | * | 6/2000 | Walsh et al. ................. 206/725 |

FOREIGN PATENT DOCUMENTS

| | | |
|---|---|---|
| GB | 2 282 798 | 4/1995 |
| JP | 62-125778 | 8/1987 |
| JP | 07-17592 | 1/1995 |
| JP | 2852872 | 11/1998 |

* cited by examiner

Primary Examiner—Shian Luung
(74) Attorney, Agent, or Firm—Sughrue Mion, PLLC

(57) ABSTRACT

A tray for storing a semiconductor device such as a BGA device. This tray comprises a storage portion for receiving and storing the BGA device therein. The storage portion has a wall surface which is arranged around the semiconductor device upon storing the semiconductor device. This wall surface has an area which is inclined with an angle so as to support an edge of a package of the semiconductor device but not to come into contact with wiring terminals thereof. With this arrangement, the inclined are comes into contact with only the edge of the package so as to be able to support the package.

15 Claims, 9 Drawing Sheets

US 6,357,595 B2

TRAY FOR SEMICONDUCTOR INTEGRATED CIRCUIT DEVICE

BACKGROUND OF THE INVENTION

1. Field of the Invention

The present invention generally relates to a tray for storing a semiconductor integrated circuit device and, more particularly, to a tray for storing a semiconductor integrated circuit device such as a ball grid array type or pin grid array type semiconductor device which has wiring terminals on the lower surface of its package.

2. Related Background Art

As the package types of semiconductor devices, ball grid array type and pin grid array type are well known. In the former type, as shown in FIGS. 1 and 2, ball terminals 1 serving as wiring terminals are arranged in a matrix on the lower surface of a package 2. The package 2 shown in FIGS. 1 and 2 is comprised of a substrate 3 and a molded resin 4 covering the upper portion of the substrate 3. In the latter type, lead pins (not shown) are used in place of ball terminals 1. Both of these types have features that the number of wiring terminals can be increased and that electric noise is small, compared to a general quad flat package.

Generally, a ball grid array type ("BGA") semiconductor device 5, or a pin grid array type ("PGA") semiconductor device is stored in the storage portion of an exclusive tray to be transported or subjected to tests. A storage portion in a conventional tray is a recess having almost the same shape as that of the package of the semiconductor device. The terminals of the semiconductor device should not be brought into contact with the tray. Therefore, through holes or recesses for receiving a ball terminal group or lead pin group are formed in the central portion of the bottom surface of the storage portion. Accordingly, the conventional tray supports the peripheral portion (a portion outside the outermost ball terminals or lead pins and indicated by reference numeral 2 in, e.g., FIG. 2) of the lower surface of the package of the semiconductor device with the peripheral portion of the bottom surface of its storage portion, and restrains horizontal movement of the package with the wall surface of the storage portion.

When the width of the peripheral portion of the lower surface of the package is small, the ball terminals or lead pins may come into contact with the inner wall surface of the terminal-accepting hole, or the edge of the package may enter the hole. Particularly, this problem becomes conspicuous in recent years because, as the package becomes more and more compact, the width of the peripheral portion of the lower surface of the package becomes narrow.

SUMMARY OF THE INVENTION

It is an object of the present invention to provide a tray for storing a semiconductor device, such as a BGA device or PGA device, having wiring terminals on the lower surface of its package, which can reliably support the semiconductor device regardless of the width of the peripheral portion of the lower surface of the package without causing the wiring terminals to come into contact with the wall surface of the storage portion.

In order to achieve the above object, according to the present invention, there is provided a tray for a semiconductor device such as a BGA device, comprising a substantially planar main body and a first storage portion provided on a first surface of the main body for storing the semiconductor device. The first storage portion has a first wall surface adapted to be arranged around the semiconductor device upon storing the semiconductor device. Also, the first wall surface has a first area which is inclined with an angle so as to support an edge of the package of the semiconductor device but not to come into contact with the wiring terminals.

With this arrangement, the inclined first area can come into contact with only the edge of the package to support the package.

In order to stabilize the semiconductor device stored in the storage portion, the first wall surface is preferably formed with a second area extending upward from an upper edge of the first area. It is effective if this second area is inclined with an angle larger than the angle of the first area.

The tray according to the present invention is also characterized by further comprising a second storage portion provided on a second surface of the tray main body opposite to the first storage portion, that can store a semiconductor device with wiring terminals thereof facing upward when the tray is turned over, wherein when a tray of the same type is stacked on this tray, the second storage portion of one tray cooperates with the first storage portion of the other tray to form a space for storing the semiconductor device.

With this arrangement, the vertical movement of the semiconductor device stored in the tray can be minimized or suppressed. When the trays are stacked and turned over, the semiconductor device can be easily transported to the second storage portion of the lower tray.

The second storage portion may comprise a second wall surface having a third area which is arranged around the semiconductor device upon storing the semiconductor device with the wiring terminals thereof facing upward, and which is inclined with an angle so as to support the edge of the package of the semiconductor device. When the tray has such a inclined area, the semiconductor device can be supported with only the edge of its package.

When the package of the semiconductor device has a rectangular or square lower surface, the first storage portion is preferably comprised of four first wall surfaces arranged to form a rectangular or square shape, and the first areas of the first wall surfaces preferably respectively support edges of the lower surface of the package of the semiconductor device.

The present invention will be more fully understood from the detailed description given hereinbelow and the attached drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

In the course of the following detailed description, reference will be made to the attached drawings in which.

DESCRIPTION OF THE PREFERRED EMBODIMENT

Figure 1:
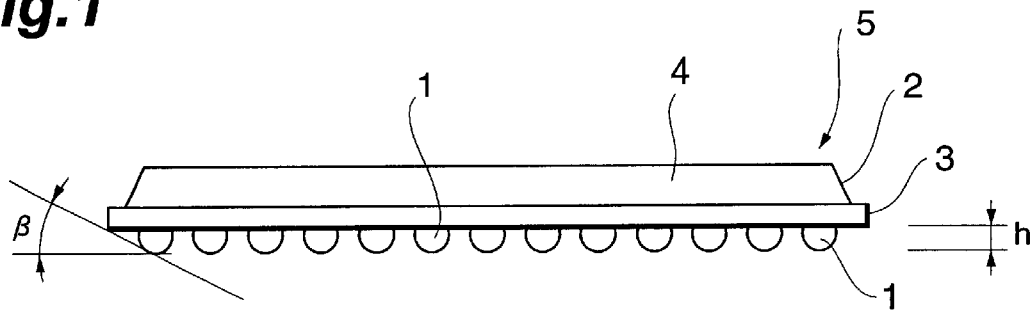
FIG. 1 is a side view showing a BGA semiconductor device that can be stored in a tray according to the present invention.
Figure 2:
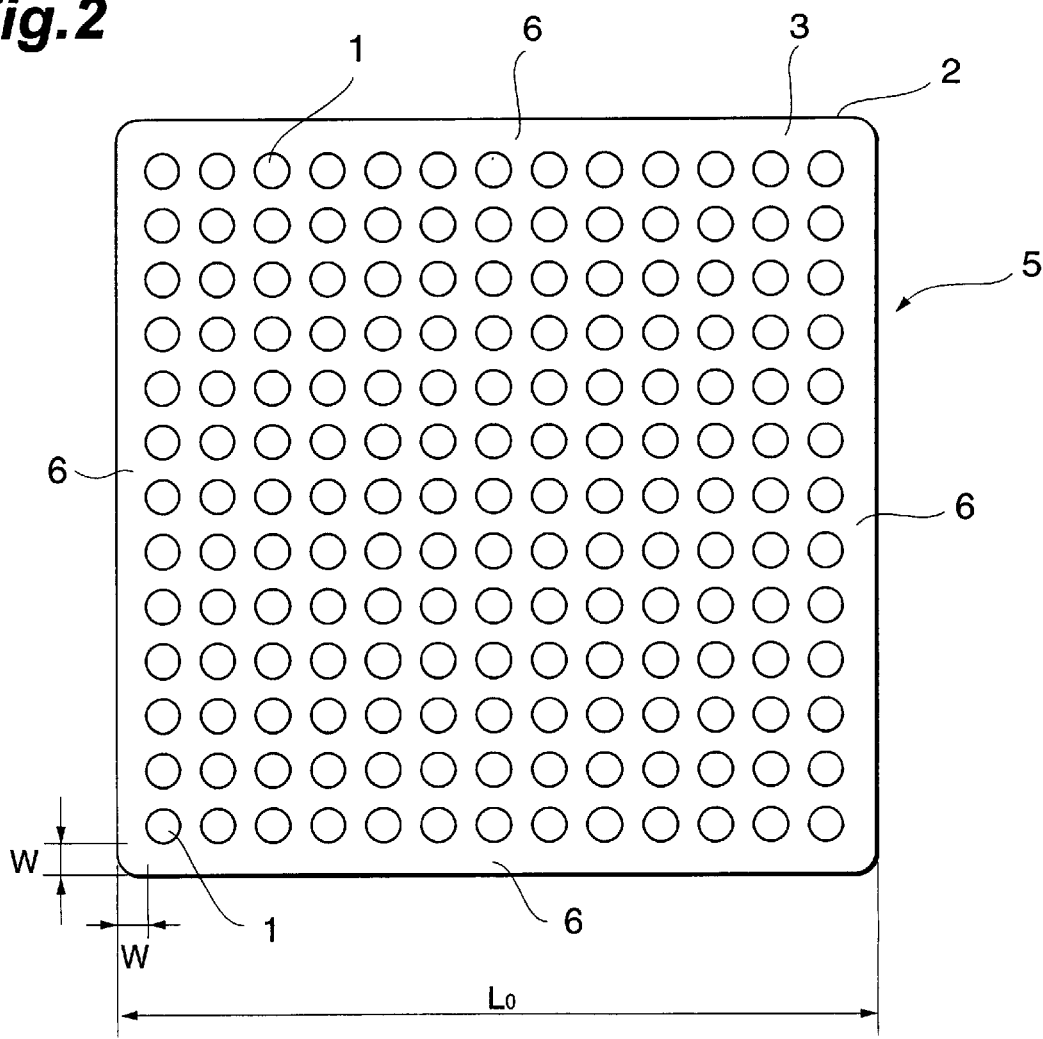
FIG. 2 is a bottom view of the BGA device as shown in FIG. 1.
Figure 3:
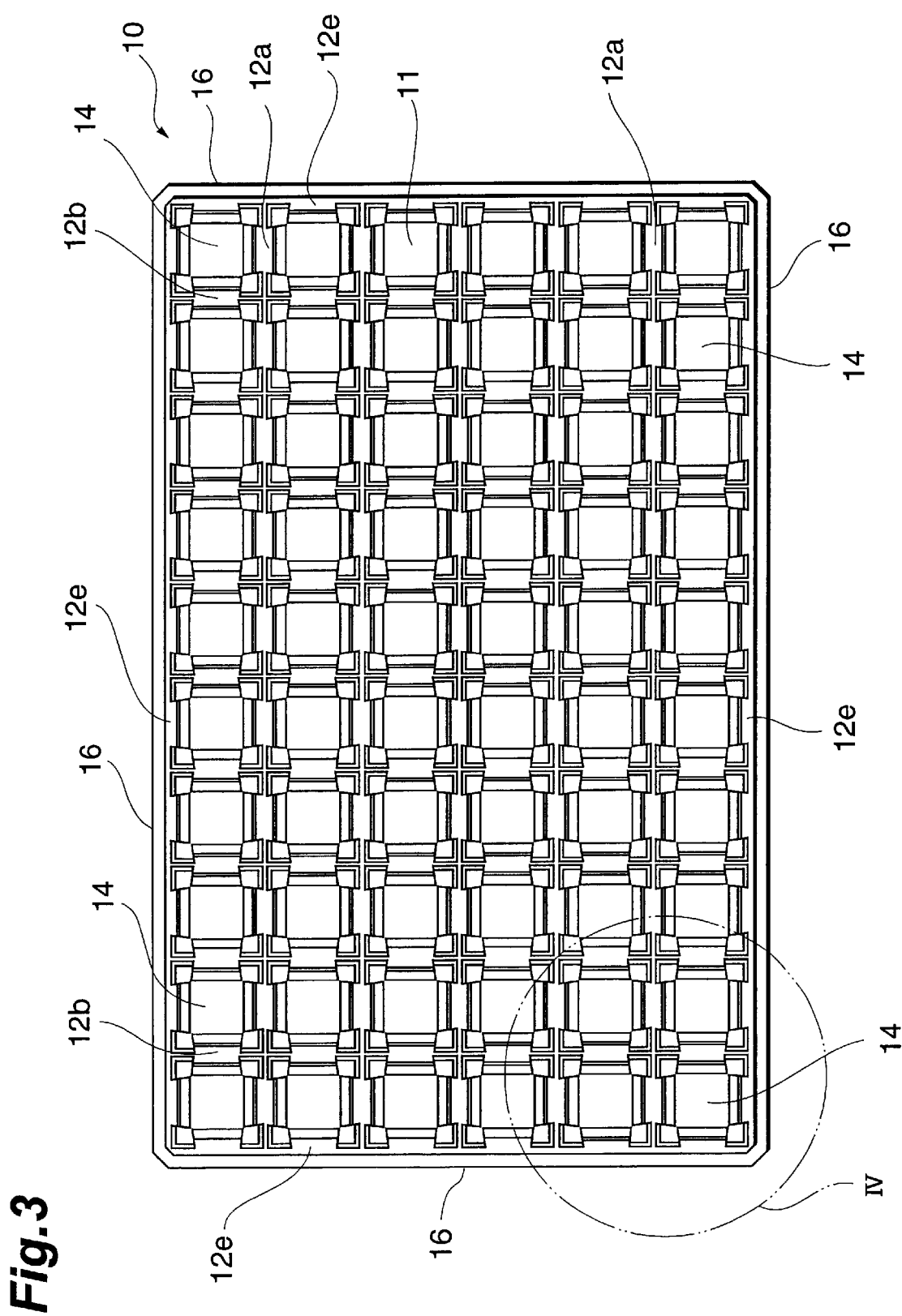
FIG. 3 is a plan view showing a tray that is constructed in accordance with the present invention for storing the BGA devices.

Referring now to the drawings, and particularly, to FIG. 3, there is shown a tray 10 for storing BGA devices, having an improved construction in accordance with the present invention. The BGA device for use in the tray 10 is one shown in FIG. 1 or 2, being designated by reference numeral 5. The BGA device has a package whose lower surface is substantially square in shape. In this specification, it is to be understood that such terms as "upper", "lower", and the like are used with reference to the ordinary use state of the tray 10, i.e., a state wherein the tray 10 is set horizontally, unless otherwise specified. In the state of FIG. 3, note that the surface which can be seen will be referred to as the upper surface of the tray 10, and that the surface which cannot be seen will be referred to as the lower surface of the tray 10.

The tray 10 of the present invention can be made from various types of materials in accordance with various types of methods. Especially, the tray 10 molded of a heat-resistant and electro-conductive synthetic resin, e.g., a polyphenylene ether-based resin mixed with a conductive filler such as carbon particles or fiber, or metal particles or fiber, a polyether sulfone-based resin, a polyether imide-based resin, a polyacryl sulfone-based resin, or a polyester-based resin is preferable, because it facilitates the manufacture, is lightweight and is easy to handle. The reason why the conductive synthetic resin is preferable is that charging in the semiconductor device to be stored must be prevented, since the semiconductor device can be damaged by static electricity.

The tray 10 shown in FIG. 3 comprises a substantially rectangular and planar main body 11. The tray 10 has a plurality of linear ridges 12 formed on the upper surface of the tray main body 11, which include those extending parallel to the longitudinal direction (long sides) of the tray 10 and those extending parallel to the widthwise direction (short sides) of the tray 10. Longitudinal ridges 12a are arranged with constant intervals, and widthwise ridges 12b are arranged at the same constant intervals. In this manner, the ridges 12 are arranged to form a matrix, and each hollow portion of the matrix, i.e., a portion surrounded by a pair of adjacent longitudinal ridges 12a and a pair of adjacent widthwise ridges 12b serve as a first storage portion 14 for storing one BGA device 5.

Figure 8:
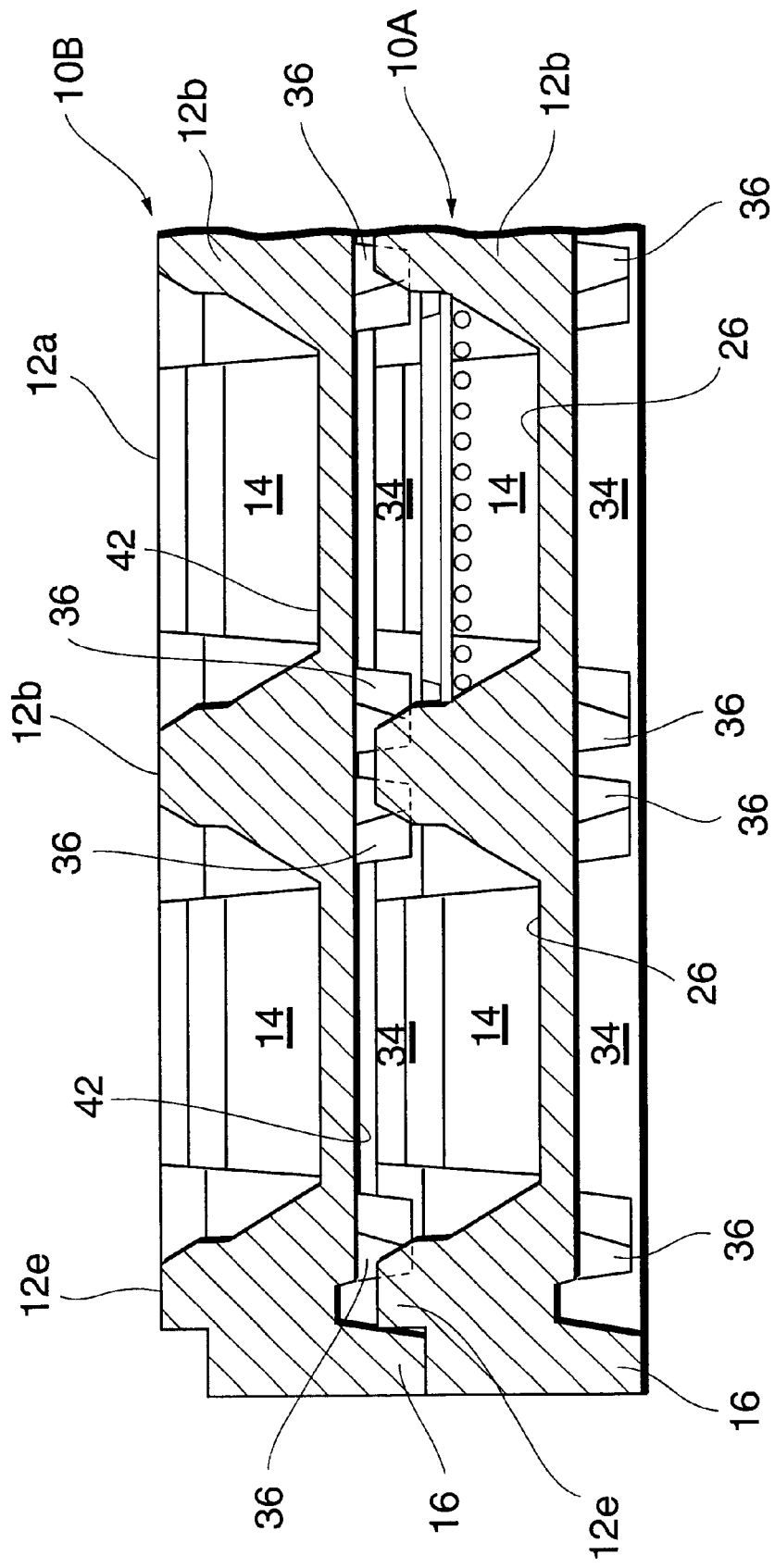
FIG. 8 is a sectional view taken along the same sectional position as in FIG. 6, showing a state wherein two trays each shown in FIG. 3 are stacked.

When a plurality of trays 10 are used as they are stacked on each other, ridges 12e arranged at the outermost peripheral portion of the tray 10 fit with the inner sides of outer frames 16 projecting downward from the peripheral edge of the upper tray 10, to serve as a positioning means for positioning the tray 10 and for preventing lateral misalignment of the tray 10 (see FIG. 8).

Figure 4:
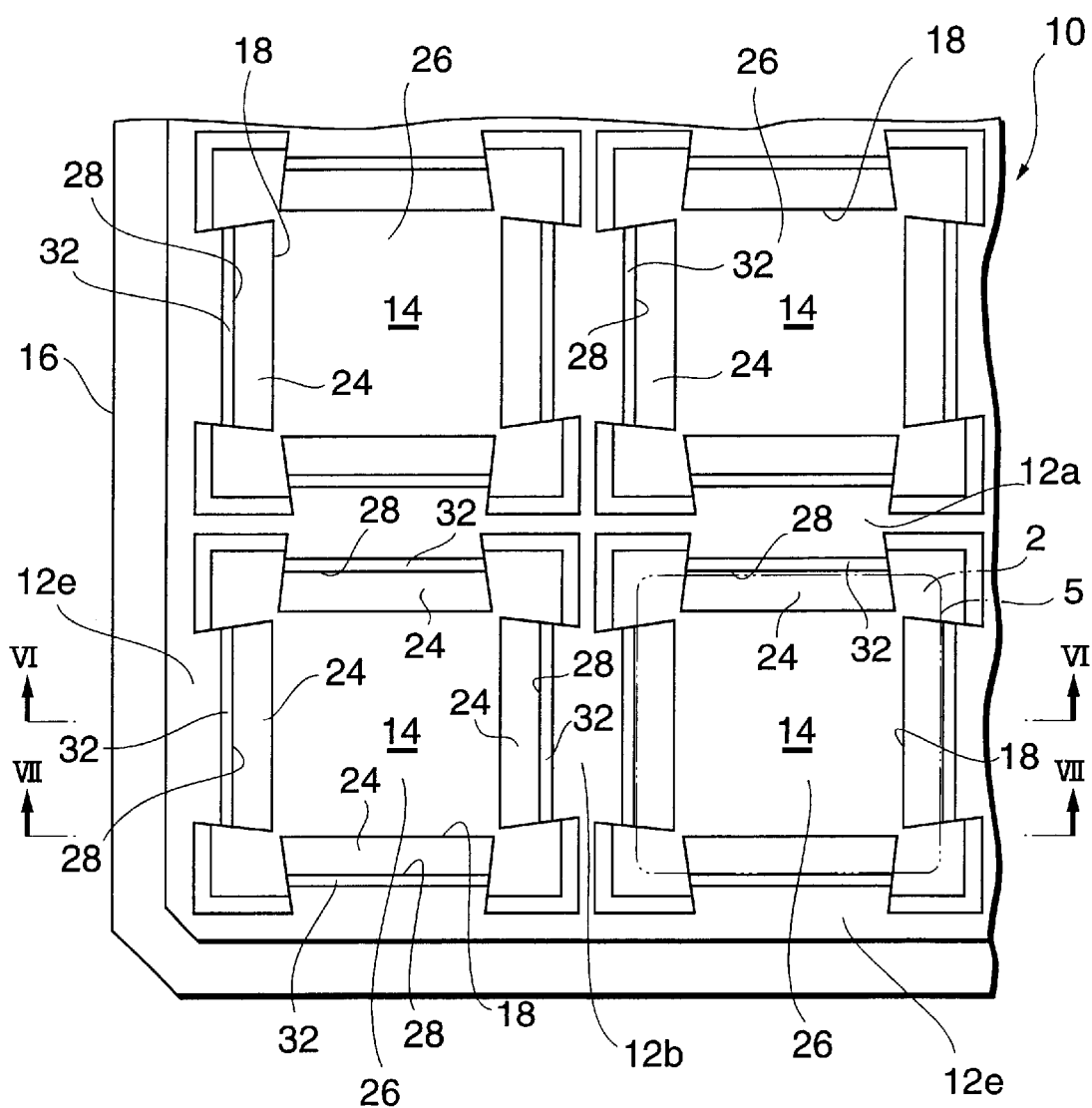
FIG. 4 is an enlarged plan view showing a portion IV of FIG. 3.
Figure 5:
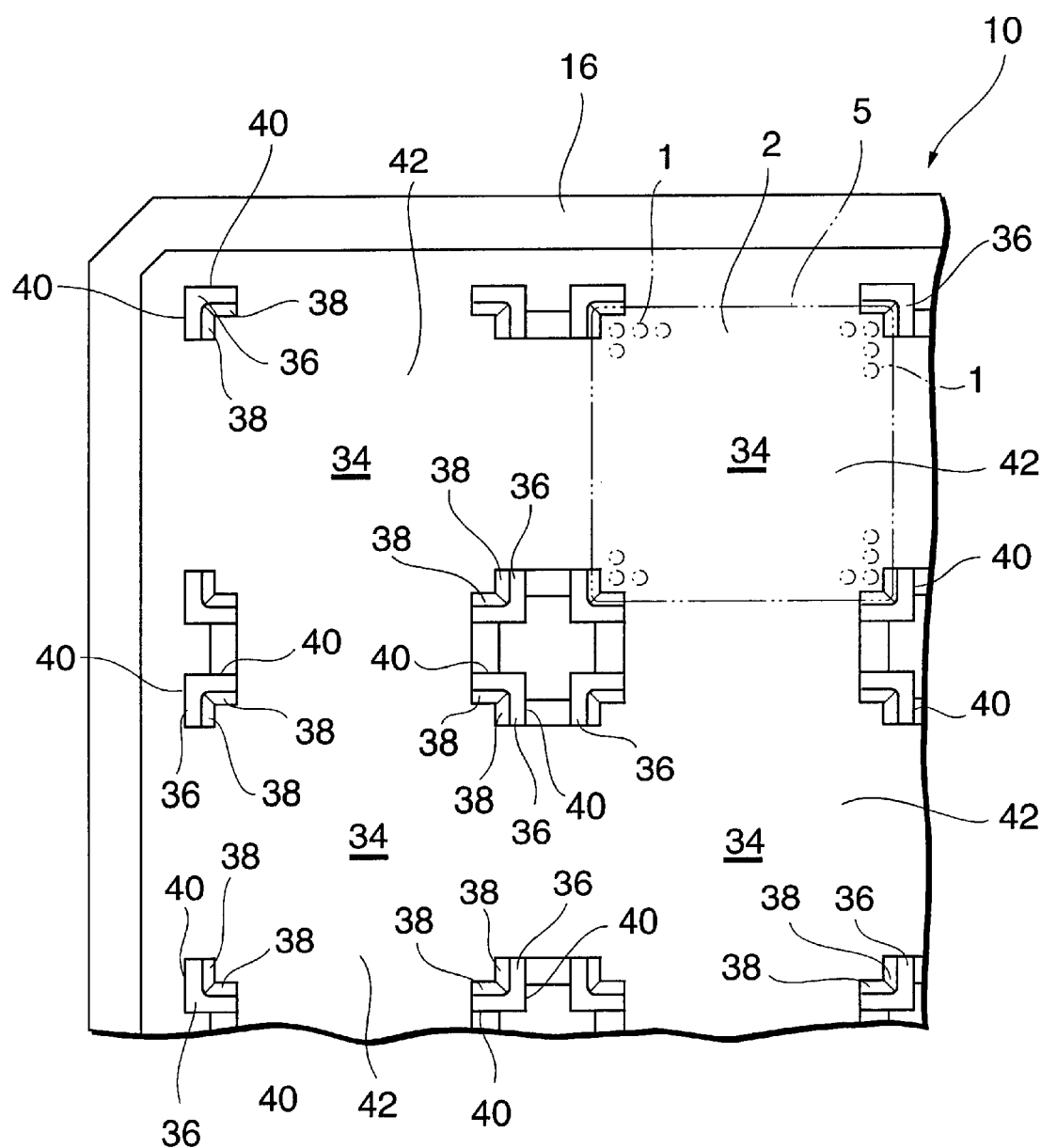
FIG. 5 is a bottom view of the same portion as that shown in FIG. 4.
Figure 6:
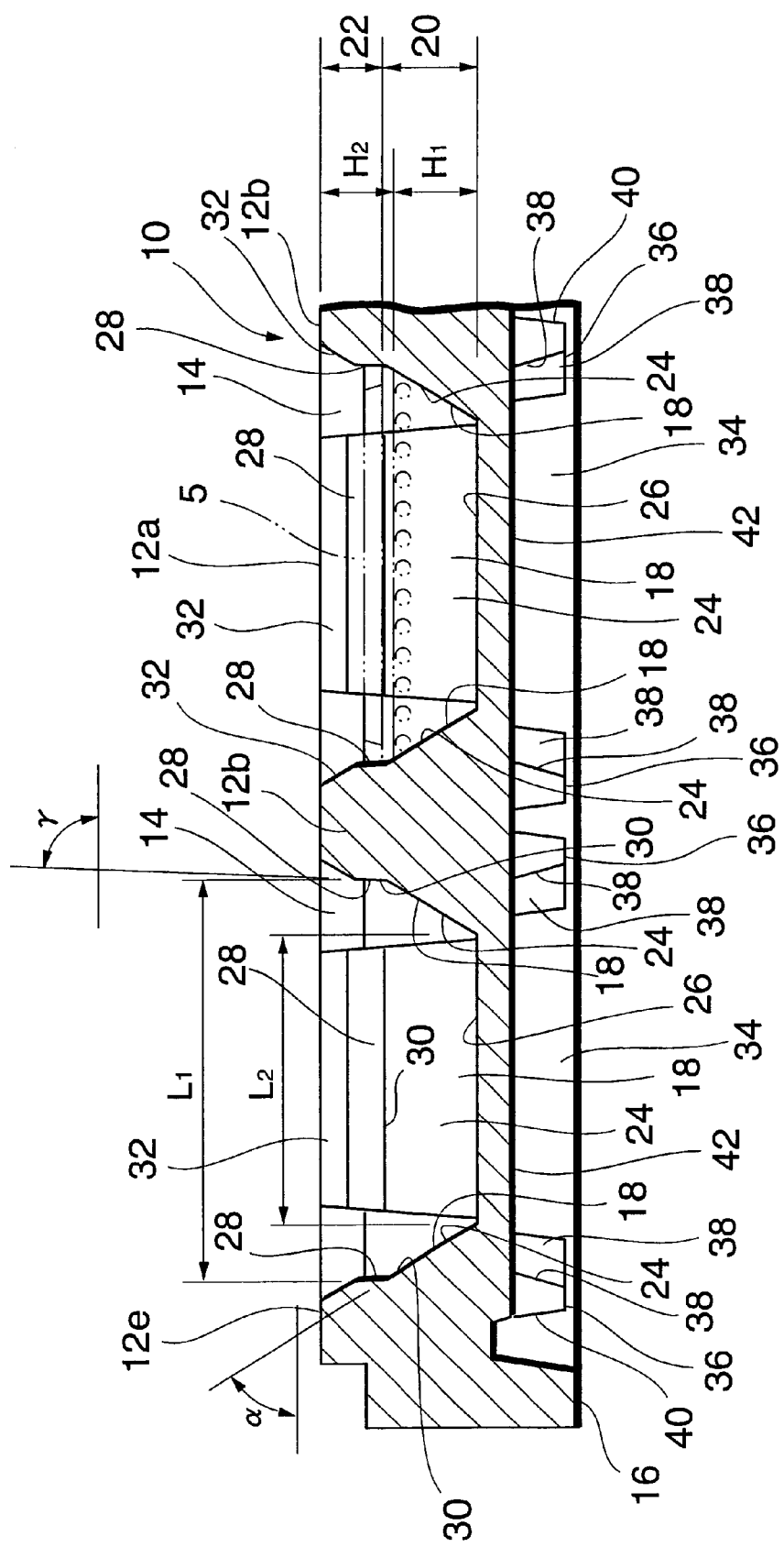
FIG. 6 is a sectional view taken along the line VI—VI of FIG. 4.
Figure 7:
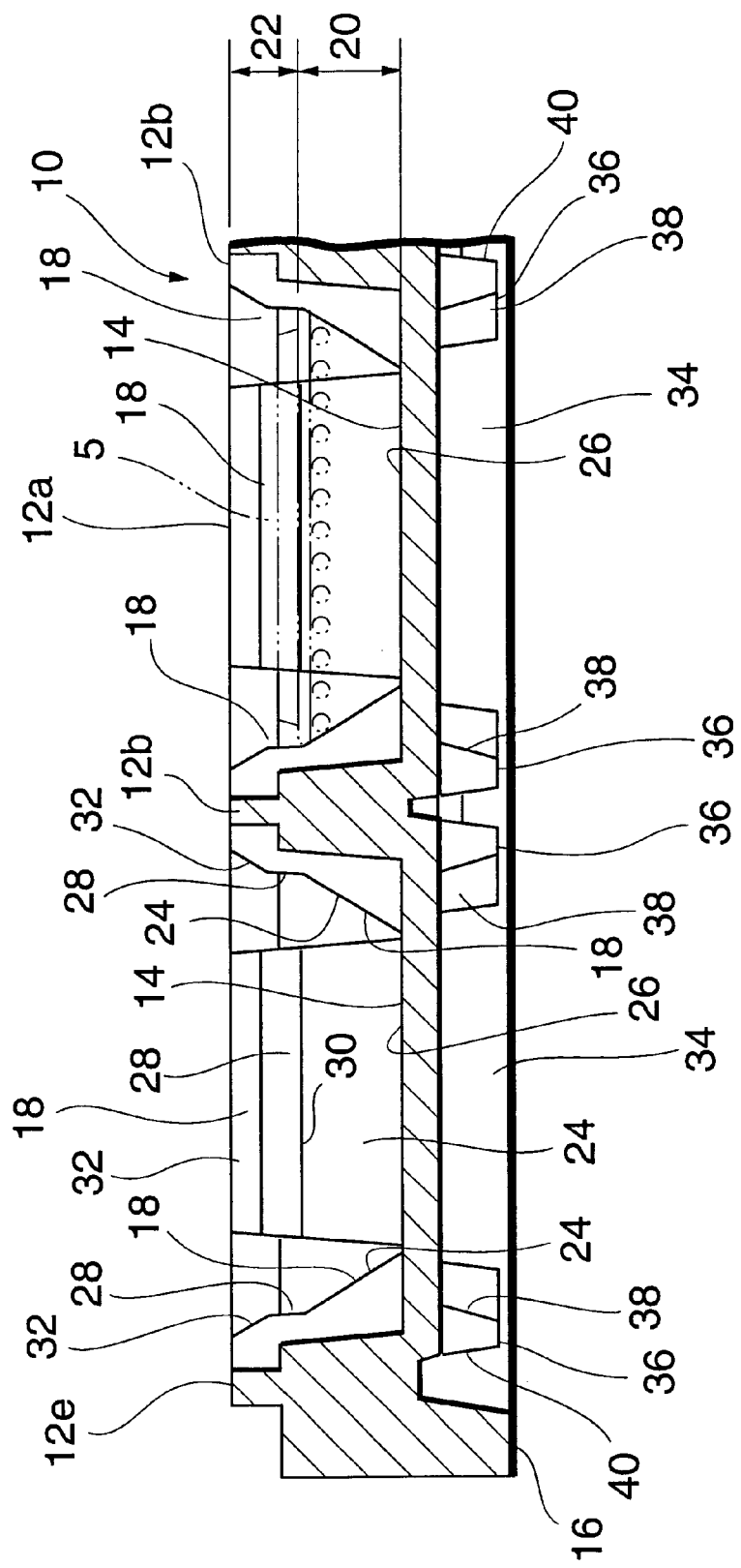
FIG. 7 is a sectional view taken along the line VII—VII of FIG. 4.

FIG. 4 is an enlarged plan view showing a portion IV of FIG. 3, and FIG. 5 is a bottom view of the same portion as that shown in FIG. 4. FIG. 6 is a sectional view taken along the line VI—VI of FIG. 4, and FIG. 7 is a sectional view taken along the line VII—VII of FIG. 4. As is understood from FIGS. 4 to 7, each storage portion 14 can store the BGA device 5 having a package 2 with a substantially square lower surface. Hence, first wall surfaces 18 of the four ridges 12 surrounding each storage portion 14 have the same shape and same size. As shown in FIGS. 6 and 7, the storage portion 14 is partitioned into a lower region 20 and an upper region 22 in the vertical direction.

The lower region 20 of the storage portion 14 supports the BGA device 5 when the BGA device 5 is stored horizontally and appropriately, and serves as the main region of the storage portion 14. The lower, first wall surface areas (to be referred to as "lower wall surfaces" hereinafter) 24 of the respective ridges 12 of the lower region 20 are more inclined toward the center of the storage portion 14. In other words, the distance, indicated by $L_1$ in FIG. 6, between the upper ends of the lower wall surfaces 24 that oppose each other is slightly larger than a length $L_0$ of one side of the package 2 shown in FIGS. 1 and 2, and the distance, indicated by $L_2$ in FIG. 6, between the lower ends of the lower wall surfaces 24 is smaller than $L_0$.

Therefore, when the BGA device 5 is moved downward in the horizontal state from above to the lower region 20 of the storage portion 14, the respective lower edges of the lower surface of the package 2 come into contact with the corresponding inclined lower wall surfaces 24 and are supported by them, as indicated by a phantom line in FIGS. 4, 6, and 7. As described above, since the four lower wall surfaces 24 surrounding one storage portion 14 have the same size and the same shape, the BGA device 5 is supported horizontally at the same height of the four lower wall surfaces 24.

In this manner, since the BGA device 5 is supported at only the lower edges of the package 2, it can be supported even if the width, indicated by W in FIG. 2, of the peripheral portion 6 of the lower surface of the package 2 is smaller than the reference size.

Note that when the BGA device 5 is supported, the ball terminals 1 should not come into contact with the lower wall surfaces 24 of the storage portion 14. Hence, the angle of the lower wall surfaces 24 with respect to the horizontal plane, indicated by $\alpha$ in FIG. 6, must be necessarily larger than the angle formed by the lower edges of the package 2 and the outermost ball terminals 1, indicated by $\beta$ in FIG. 1. Even when this condition is satisfied, if the angle $\alpha$ of the lower wall surfaces 24 becomes less than 40°, the BGA device 5 may be moved in the storage portion 14 when a very small vibration is applied to the tray 10. Therefore, the angle $\alpha$ is preferably 40° or more. Also, when the angle $\alpha$ of the lower wall surfaces 24 exceeds 70°, the package 2 bites into the lower wall surfaces 24 and becomes difficult to remove. Therefore, the angle $\alpha$ is preferably 70° or less.

Further, while the BGA device 5 is supported, the ball terminals 1 should not come into contact with a bottom surface 26 of the storage portion 14. For this reason, the height, indicated by $H_1$ in FIG. 6, from the bottom surface 26 of the storage portion 14 to a package support point S is set larger than the length, indicated by h in FIG. 1, from the lower surface of the package 2 to the lower ends of the ball terminals 1.

When the BGA device 5 supported by the lower wall surfaces 24 is displaced, second wall surface areas (to be referred to as "upper wall surfaces" hereinafter) 28 of the respective ridges 12 in the upper region 22 of the storage portion 14 restrain this displacement. The angle, indicated by $\gamma$ in FIG. 6, of the upper wall surfaces 28 with respect to the horizontal plane is set larger than the angle $\alpha$ of the lower wall surfaces 24 and is preferably 85° to 90°. In this manner, with the upper wall surfaces 28 sharply rising from the upper edges of the lower wall surfaces 24, even if the BGA device 5 is displaced in the horizontal direction, when the lower edges of the package 2 reach boundaries 30 between the lower and upper wall surfaces 24 and 28, further horizontal movement of the BGA device 5 is prohibited by the upper wall surfaces 28.

The height, indicated by $H_2$ in FIG. 6, from the package support point S to the upper edges of the upper wall surfaces 28 is preferably larger than the thickness of the package 2. Then, for example, when a flat plate (not shown) is placed on the tray 10, the BGA device 5 is completely stored in the space surrounded by the lower surface of the flat plate and the storage portion 14, and can be avoided from being interfered with the flat plate. In order to allow the BGA device 5 to be stored in the storage portion 14 easily, the upper edges of the upper wall surfaces 28 are preferably chamfered as indicated by numerals 32.

The lower and upper wall surfaces 24 and 28 described above need not extend over the entire lengths of the ridges 12 surrounding the storage portion 14. In the shown embodiment, the ridges 12 at the corners of the storage portion 14 may be formed thin. In this case, the corners of the package 2 float.

With BGA device storage trays, for example, when the ball terminals 1 are to be inspected, sometimes the empty second tray is stacked on the first tray storing the BGA devices 5, and these trays are turned over in the stacked state, so that the ball terminals 1 of the BGA devices 5 face upward. Generally, storage portions are formed on the lower side of the second tray as well so that the second tray can also store the BGA devices when the trays are turned over.

Hence, the tray 10 of the shown embodiment also has a plurality of second storage portions 34 in its lower side. These lower side storage portions 34 correspond in number to the upper side storage portions 14 described above, and are formed immediately under the upper side storage portions 14. Accordingly, as shown in FIG. 8, when a tray 10B of the same type as a tray 10A is stacked on the tray 10A and outermost ridges 12e of the lower tray 10A and an outer frame 16 of the upper tray 10B are engaged with each other, each lower side storage portion 34 of the upper tray 10B is located to cover a corresponding upper side storage portion 14 of the lower tray 10A, so that a space for storing one BGA device 5 is formed between these storage portions 14 and 34.

This will be described in more detail. As is understood from FIG. 5, each storage portion 34 on the lower side of the tray 10 is made up of four projecting pieces 36 projecting downward from the lower surface of the tray main body 11. The projecting pieces 36 are arranged at the corners of the storage portion 34, i.e., positions corresponding to the intersections of the ridges 12 on the upper surface of the tray 10. The projecting pieces 36 each forming an L shape when seen in a horizontal section and are positioned such that their inner wall surfaces or second wall surfaces 38 restrain the corners of the package 2. When the two trays 10A and 10B are stacked, the four projecting pieces 36 defining one lower side storage portion 34 are fitted with the corner portions of the corresponding upper side storage portion 14, and outer wall surfaces 40 of the respective projecting pieces 36 face the inner surfaces of the thin portions of the ridges 12. In this state, a bottom surface 26 of the upper side storage portion 14 of the lower tray 10A, a bottom surface 42 of the lower side storage portion 34 of the upper tray 10B, the linear ridges 12, and the projecting pieces 36 form a closed space. The BGA device 5 is stored in this space such that its movement is prevented or minimized in the vertical direction as well.

Figure 9:
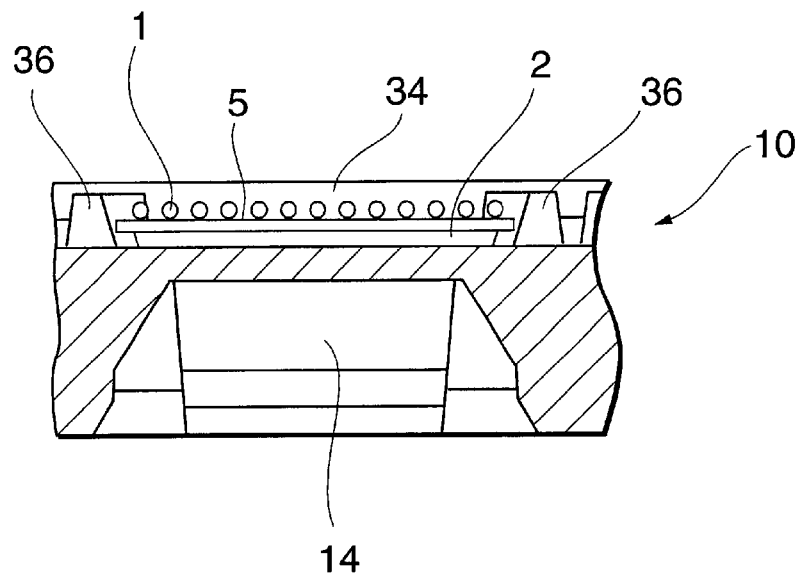
FIG. 9 is a sectional view taken along the same sectional position as in FIG. 6, showing a state wherein a BGA device is arranged in the storage portion on the lower side of the tray shown in FIG. 3.

The minimum distance between the opposing wall surfaces 38 is larger than the maximum length of the BGA package 2. Hence, when the tray 10 is turned over and the BGA devices 5 are stored in its lower storage portions 34, the upper surfaces of the packages 2 are in contact with the bottom surfaces 42 of the storage portions 34, as shown in FIGS. 5 and 9.

In the above embodiment, the sizes, positions, and shapes of the respective parts of the storage portions 14 and 34, the inclination angles of the wall surfaces 18 and 38, and the like may be changed in various manners in accordance with the size of the BGA device to be handled, the material of the package, and the like, and may be adjusted through experiments and simulations. For example, the possible movement of the BGA device 5 occurred when a vibration is applied to the tray 10 includes various types. The lower edges of the package may slide on the lower wall surfaces 24 in the longitudinal or widthwise direction of the tray 10. Alternatively, the BGA package 2 may vertically move to come into contact with the lower surface of the upper tray 10B, may rotate about the central point of the BGA 5 as the center, or may swing about opposing corners as fulcrums. Therefore, conditions with which the ball terminals 1 do not always come into contact with the surfaces of the tray 10 must be determined while considering the fact that these movements can occur in the BGA device 5. When satisfying these conditions, the wall surfaces 24, 28, and 38 need not always be flat surfaces, but may be modified to be curved to form projections or recesses.

Figure 10:
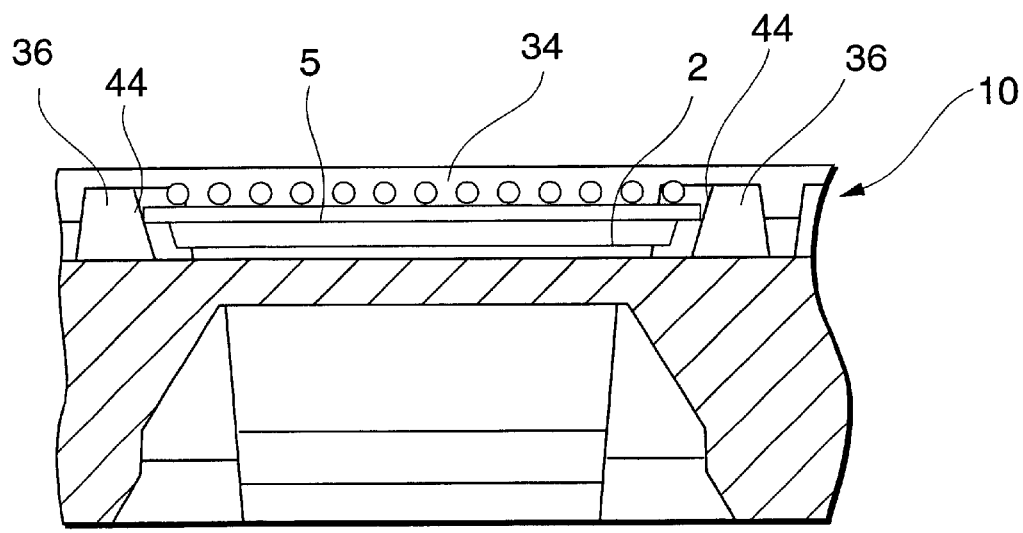
FIG. 10 is a sectional view taken along the same sectional position as in FIG. 6, showing a modification of a tray according to the present invention.
Figure 11:
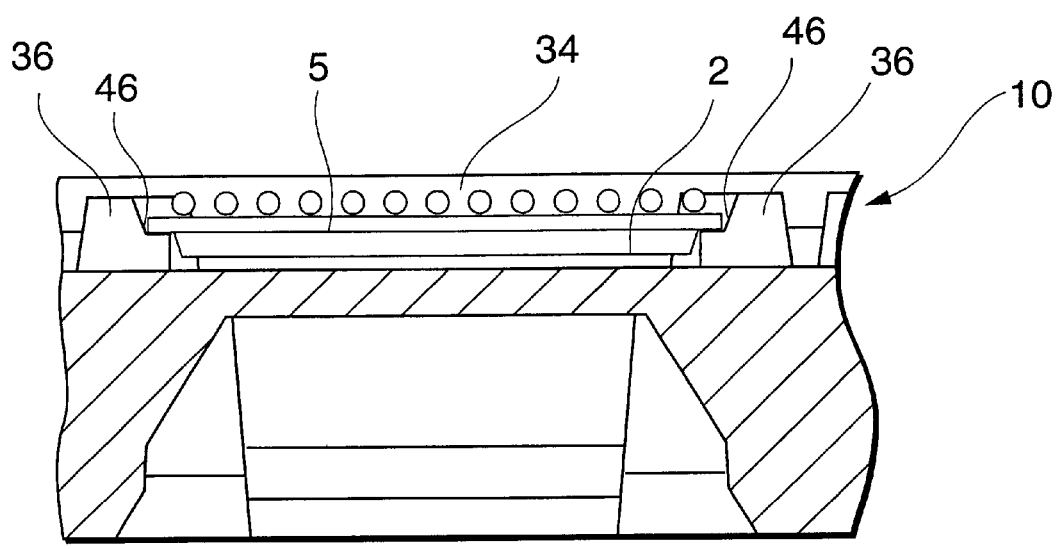
FIG. 11 is a sectional view taken along the same sectional position as in FIG. 6, showing another modification of a tray according to the present invention.

Although the preferred embodiment of the present invention has been described in detail so far, the present invention is not limited by it. For example, in the above embodiment, the projecting pieces 36 on the lower side of the tray do not support the BGA device 5. However, as shown in FIG. 10, the inner wall surfaces of the projecting pieces 36 may form as inclined surfaces or third wall surface areas 44, and the upper edges of the package 2 may be supported by the wall surfaces 44. Alternatively, as shown in FIG. 11, step portions 46 may be formed on the inner wall surfaces of the projecting pieces 36, and the peripheral portion of the upper surface of the package 2 may be supported by the step portions 46.

In the above embodiment, the present invention is applied to the BGA device tray 10. The present invention may also be applied to a tray for storing PGA devices or other semiconductor devices each having wiring terminals on the lower surface of the package.

Although, the above embodiment can store a semiconductor device with a substantially square package, the present invention may be applied to a semiconductor device having a package of another shape. In such a case, inclined wall surface areas for supporting the edges of the package may be formed on the wall surfaces of the storage portion that surround the semiconductor device continuously or discontinuously.

As has been described above, with the tray according to the present invention, even if the wiring terminal portions are disposed at positions near the peripheral edge of the lower surface of the package of a semiconductor device, the tray can support the semiconductor device. Since this support is achieved at only the edges of the package, ball terminals can be prevented from coming into contact with the wall surfaces or bottom surface of the storage portion. Therefore, with the tray of the present invention, when a semiconductor device is stored and transported, damage, deformation, and contamination of the ball terminals caused by contact with the wall surface of the storage portion can be prevented.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A tray for storing a semiconductor integrated circuit device having a package and wiring terminals on a lower surface of the package, said tray comprising:
    a substantially planar main body; and
    a first storage portion provided on a first surface of said main body for storing the semiconductor integrated circuit device, said first storage portion having a bottom surface and a first wall surface extending from said bottom surface and arranged around the semiconductor integrated circuit device when the semiconductor integrated device is stored in said first storage portion,
    a second wall surface disposed around a circumference of the semiconductor integrated circuit device so as to limit horizontal movement of the semiconductor integrated circuit device, said first wall surface being inclined at an angle so as to support an edge of the package of the semiconductor integrated circuit device such that the wiring terminals of the semiconductor integrated circuit device do not contact said first wall surface when the semiconductor integrated circuit device is stored in said first storage portion, and said second wall surface extending from said first wall surface in a direction away from said first wall surface of said main body, wherein said second wall surface is inclined at an angle larger than the angle of said first wall surface, with respect to the horizontal.

2. A tray according to claim 1, wherein said first storage portion is designed so as to prevent said first surface of said main body from coming into contact with the wiring terminals of the semiconductor integrated circuit device when the semiconductor integrated circuit device is stored in said first storage portion.

3. A tray according to claim 1, wherein said main body includes a plurality of intersecting ridges provided on said first surface thereof, and wherein said first storage portion is defined by a first pair of adjacent ones of said ridges and a second pair of adjacent ones of said ridges extending transversely to said first pair.

4. A tray according to claim 3, wherein each of said first and second pairs of ridges defining said first storage portion has a wall surface for serving as said first wall surface, whereby said wall surfaces of said first and second pairs of ridges respectively support edges of a lower surface of the rectangular package of the semiconductor integrated circuit device.

5. A tray according to claim 1, further comprising a second storage portion provided on a second surface of said main body opposite to said first storage portion,
    wherein said second storage portion can store a semiconductor integrated circuit device with wiring terminals thereof facing upward when said tray is turned over, and
    wherein when two of said trays are aligned in a stacked relationship, said second storage portion of one tray cooperates with said first storage portion of the other tray to form a space for storing the semiconductor integrated circuit device.

6. A tray according to claim 5, wherein said second storage portion has a second wall surface adapted to be arranged around the semiconductor integrated circuit device when the semiconductor integrated circuit device is stored in said second storage portion with the wiring terminals thereof facing upward, and
    wherein said second wall surface has a third area which is inclined with an angle so as to support an edge of the package of the semiconductor integrated circuit device when the semiconductor integrated circuit device is stored in said second storage portion.

7. A tray according to claim 5, further comprising positioning means for positioning said stacked trays to each other.

8. A tray according to claim 5, wherein said main body includes a plurality of projecting pieces provided on said second surface thereof for defining said second storage portion, and wherein each of said projecting pieces has a wall surface for serving as said second wall surface, whereby said wall surfaces of said projecting pieces respectively support corners of the rectangular package of the semiconductor integrated circuit device.

9. A tray according to claim 1, wherein said first area is inclined at an angle between 40 degrees and 70 degrees.

10. A tray according to claim 1, wherein said second area is inclined at an angle between 85 degrees and 90 degrees.

11. A tray according to claim 1, wherein said first area is inclined at an angle between 40 degrees and 70 degrees, and said second area is inclined at an angle between 85 degrees and 90 degrees.

12. A tray for storing a semiconductor integrated circuit device having a package and wiring terminals on a lower surface of the package, said tray comprising:
    a substantially planar main body;
    a first storage portion provided on a first surface of said main body for storing the semiconductor integrated circuit device, said first storage portion having a first wall surface adapted to be arranged around the semiconductor integrated circuit device when the semiconductor integrated device is stored in said first storage portion, wherein said first wall surface has a first area which is inclined at an angle so as to support an edge of the package of the semiconductor integrated circuit device and to prevent said first wall surface from coming into contact with the wiring terminals of the semiconductor integrated circuit device when the semiconductor integrated circuit device is stored in said first storage portion; and
    a second storage portion provided on a second surface of said main body opposite to said first storage portion, wherein said second storage portion can store a semiconductor integrated circuit device with wiring terminals thereof facing upward when said tray is turned over, and wherein when two of said trays are aligned in a stacked relationship said second storage portion of one tray cooperates with said first storage portion of the other tray to form a space for storing the semiconductor integrated circuit device, and when said two aligned trays are not turned over, the one of said two trays which is positioned on top, does not make contact with a stored semiconductor integrated circuit device.

13. A tray according to claim 12, wherein said second storage portion has a second wall surface adapted to be arranged around the semiconductor integrated circuit device when the semiconductor integrated circuit device is stored in said second storage portion with the wiring terminals thereof facing upward, and wherein said second wall surface has a third area which is inclined at an angle so as to support an edge of the package of the semiconductor integrated circuit device when the semiconductor integrated circuit device is stored in said second stage portion.

14. A tray according to claim 12, further comprising positioning means for positioning said stacked trays to each other.

15. A tray according to claim 12, wherein said main body includes a plurality of projecting pieces provided on said second surface thereof for defining said second storage portion, and wherein each of said projecting pieces has a wall surface for serving as said second wall surface, whereby said wall surfaces of said projecting pieces respectively support corners of the rectangular package of the semiconductor integrated circuit device, when said tray is in a turned-over state.

* * * * *

US006357595C1

(12) INTER PARTES REEXAMINATION CERTIFICATE (662nd)
United States Patent
Sembonmatsu et al.

(10) Number: US 6,357,595 C1
(45) Certificate Issued: Aug. 13, 2013

(54) TRAY FOR SEMICONDUCTOR INTEGRATED CIRCUIT DEVICE

(75) Inventors: Shigeru Sembonmatsu, Tokyo (JP); Manabu Ishikawa, Ichibara (JP)

(73) Assignee: Entegris, Inc., Billerica, MA (US)

Reexamination Request:
No. 95/000,006, Dec. 4, 2002

Reexamination Certificate for:
Patent No.: 6,357,595
Issued: Mar. 19, 2002
Appl. No.: 09/559,348
Filed: Apr. 27, 2000

(30) Foreign Application Priority Data

Apr. 30, 1999 (JP) .................................... 11/124326

(51) Int. Cl.
  *B65D 85/00*  (2006.01)
(52) U.S. Cl.
  USPC .......................................... 206/726; 206/564
(58) Field of Classification Search
  None
  See application file for complete search history.

(56) References Cited

To view the complete listing of prior art documents cited during the proceeding for Reexamination Control Number 95/000,006, please refer to the USPTO's public Patent Application Information Retrieval (PAIR) system under the Display References tab.

*Primary Examiner* — Jimmy G. Foster

(57) ABSTRACT

A tray for storing a semiconductor device such as a BGA device. This tray comprises a storage portion for receiving and storing the BGA device therein. The storage portion has a wall surface which is arranged around the semiconductor device upon storing the semiconductor device. This wall surface has an area which is inclined with an angle so as to support an edge of a package of the semiconductor device but not to come into contact with wiring terminals thereof. With this arrangement, the inclined are comes into contact with only the edge of the package so as to he able to support the package.

At the time of issuance and publication of this certificate, the patent remains subject to pending reissue application number 13/941,976 filed Jul. 15, 2013. The claim content of the patent may be subsequently revised if a reissue patent is issued from the reissue application.

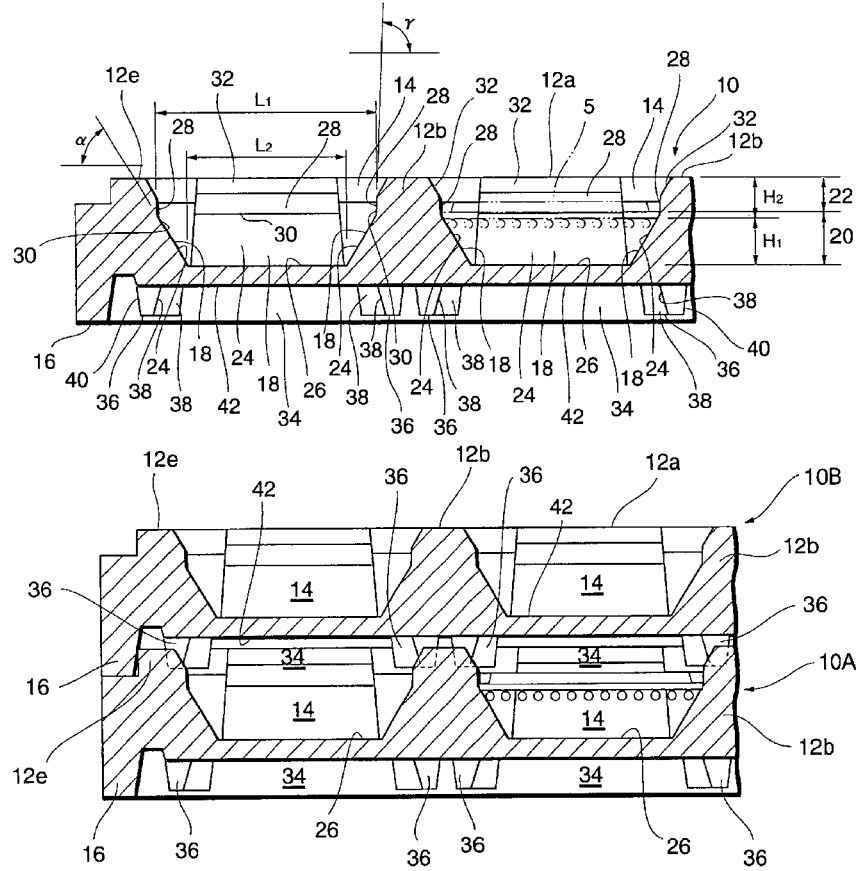

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-15 are cancelled.

\* \* \* \* \*